(12) United States Patent  
Lin

(10) Patent No.: US 7,428,284 B2  
(45) Date of Patent: Sep. 23, 2008

(54) PHASE DETECTOR AND METHOD PROVIDING RAPID LOCKING OF DELAY-LOCK LOOPS

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 571 days.

(21) Appl. No.: 11/080,105

(22) Filed: Mar. 14, 2005

(65) Prior Publication Data

US 2006/0203948 A1 Sep. 14, 2006

(51) Int. Cl.  
*H04L 7/00* (2006.01)

(52) U.S. Cl. ............... 375/355; 375/373; 375/376; 327/112; 327/158; 331/16; 331/17

(58) Field of Classification Search .......... 375/355, 375/371, 373, 376; 327/12, 158, 3, 116, 327/112; 365/233; 331/16, 17  
See application file for complete search history.

(56) References Cited

U.S. PATENT DOCUMENTS

| | | | |
|---|---|---|---|
| 4,225,858 A | 9/1980 | Cole et al. | 340/554 |
| 4,959,617 A * | 9/1990 | Martin | 327/12 |
| 5,192,915 A | 3/1993 | Mathieu et al. | 328/133 |
| 5,528,632 A | 6/1996 | Lin | 375/324 |
| 5,583,458 A | 12/1996 | Bazes | 327/3 |
| 5,659,268 A | 8/1997 | Kesner | 331/1 A |
| 5,663,685 A | 9/1997 | Kesner | 331/1 A |
| 5,744,983 A | 4/1998 | Bazes | 327/3 |
| 5,754,080 A | 5/1998 | Chen et al. | 331/25 |
| 5,956,304 A | 9/1999 | Supino et al. | 369/44.34 |
| 6,005,426 A | 12/1999 | Lin et al. | 327/158 |
| 6,111,925 A | 8/2000 | Chi | 375/354 |
| 6,198,355 B1 | 3/2001 | Lindquist et al. | 331/27 |
| 6,239,627 B1 * | 5/2001 | Brown et al. | 327/116 |
| 6,239,634 B1 | 5/2001 | McDonagh | 327/158 |
| 6,255,870 B1 | 7/2001 | Na | 327/149 |
| 6,285,219 B1 | 9/2001 | Pauls | 327/3 |
| 6,342,796 B2 | 1/2002 | Jung | 327/141 |
| 6,411,143 B1 | 6/2002 | Fernandez-Texon | 327/156 |
| 6,459,314 B2 | 10/2002 | Kim | 327/161 |
| 6,535,566 B1 * | 3/2003 | Tamamura et al. | 375/371 |
| 6,617,883 B1 | 9/2003 | Kuhn | 327/3 |
| 6,621,315 B2 | 9/2003 | Heo et al. | 327/158 |
| 6,639,958 B1 | 10/2003 | Höhler et al. | 375/376 |
| 6,683,478 B2 | 1/2004 | Yoo | 327/12 |
| 6,696,872 B1 | 2/2004 | Le et al. | 327/158 |

(Continued)

*Primary Examiner*—Chieh M. Fan  
*Assistant Examiner*—Sudhanshu C. Pathak  
(74) *Attorney, Agent, or Firm*—Dorsey & Whitney, LLP

(57) ABSTRACT

A delay-lock loop includes a dual mode phase detector. The dual mode phase detector includes a single edge phase detector that generates output signals indicative of the phase relationship between the rising edge of a reference signal and the rising edge of a feedback signal generated by the delay-lock loop. The dual mode phase detector also includes a dual edge phase detector that generates output signals indicative of the phase relationship between both the rising edge of a reference signal and the rising edge of the feedback signal and the falling edge of a reference signal and the falling edge of the feedback signal. A lock detector controls a switch so that it couples the output signals from the single edge phase detector to a delay line when the loop is locked, and it otherwise couples the output signals from the dual edge phase detector to the delay line.

55 Claims, 9 Drawing Sheets

U.S. PATENT DOCUMENTS

| | | | |
|---|---|---|---|
| 6,774,690 B2 * | 8/2004 | Baker et al. | 327/158 |
| 6,777,990 B2 | 8/2004 | Partsch et al. | 327/149 |
| 6,779,126 B1 | 8/2004 | Lin et al. | 713/500 |
| 6,798,858 B1 | 9/2004 | Atallah et al. | 375/373 |
| 6,809,601 B2 | 10/2004 | Da Dalt | 331/25 |
| 6,822,433 B1 | 11/2004 | Gilbert | 324/76.77 |
| 6,867,627 B1 | 3/2005 | Murtagh | 327/158 |
| 6,891,415 B2 * | 5/2005 | Mikhalev et al. | 327/158 |
| 6,943,602 B1 | 9/2005 | Lee | 327/158 |
| 6,950,488 B2 | 9/2005 | Chung et al. | 375/376 |
| 6,973,147 B2 * | 12/2005 | Christensen et al. | 375/355 |
| 6,987,701 B2 | 1/2006 | Lin et al. | 365/194 |
| 6,988,218 B2 | 1/2006 | Drexler | 713/600 |
| 6,989,700 B2 | 1/2006 | Kim | 327/158 |
| 7,015,725 B1 | 3/2006 | Yu et al. | 327/12 |
| 7,061,613 B1 | 6/2006 | Huang et al. | 356/364 |
| 7,088,156 B2 | 8/2006 | Kim | 327/149 |
| 7,091,714 B2 | 8/2006 | Gilbert | 324/76.77 |
| 7,098,712 B2 | 8/2006 | Lee | 327/161 |
| 7,109,760 B1 | 9/2006 | Lin | 327/12 |
| 7,109,774 B2 | 9/2006 | Kim | 327/277 |
| 7,119,591 B1 | 10/2006 | Lin | 327/158 |
| 7,123,525 B2 | 10/2006 | Lin et al. | 365/194 |
| 7,126,874 B2 * | 10/2006 | Lin et al. | 365/233 |
| 7,161,391 B2 * | 1/2007 | Lin | 327/3 |

* cited by examiner

PHASE DETECTOR AND METHOD PROVIDING RAPID LOCKING OF DELAY-LOCK LOOPS

TECHNICAL FIELD

This invention relates to clock generating systems and methods, and, more particularly, to a phase detector that may be used in a delay-lock loop that operates in a manner that allows the loop to rapidly achieve a locked condition.

BACKGROUND OF THE INVENTION

Periodic digital signals are commonly used in a variety of electronic devices. Probably the most common type of periodic digital signals are clock signals that are typically used to establish the timing of a digital signal or the timing at which an operation is performed on a digital signal. For example, data signals are typically coupled to and from memory devices, such as synchronous dynamic random access memory ("SDRAM") devices, in synchronism with a clock or data strobe signal. More specifically, read data signals are typically coupled from a memory device in synchronism with a read data strobe signal. The read data strobe signal typically has the same phase as the read data signals, and it is normally generated by the same memory device that is outputting the read data signals. However, by the time the read data strobe signal has propagated to circuitry such as latches that are used to capture the read data signals, the timing of the read strobe signal may have varied from the desired timing. It is therefore sometimes necessary to adjust the timing of the read data strobe signal.

Write data signals are typically latched into a memory device in synchronism with a write data strobe signal. The write data strobe signal has a phase that is the quadrature of the write data signals so that a transition of the write data strobe signal occurs during a "data eye" occurring at the center of the period in which the write data signals are valid. The write strobe signal is typically generated by the memory controller from an internal clock signal that is derived from the system clock signal, and it is coupled to the memory device into which the data are being written. Unfortunately, the phase of the system clock signal is normally substantially the same as the phase of the write data signals. Therefore, it is necessary for the memory controller to generate the write data strobe signal as a quadrature signal having a phase that is 90-degrees relative to the phase of the internal clock signal. In other cases, a quadrature clock signal used for latching write data is generated in the memory device to which the data are being written. The quadrature clock signal is typically generated in the memory device from an internal clock signal that is also derived from the system clock signal. Other periodic signals are also sometimes used in integrated circuits, such as memory devices, for a variety of purposes.

Various techniques can be used and have been used by integrated circuits, such as memory controllers and memory devices, to control the timing of periodic signals, such as clock signals and strobe signals. For example, a delay-lock loop, such as the delay-lock loop 10 shown in FIG. 1, can be used for this purpose. The delay-lock loop 10 includes a phase detector 14 to which a reference signal $S_R$ and a feedback signal $S_{FB}$ are coupled. The phase detector 14 compares the phase of the $S_R$ signal to the phase of the $S_{FB}$ signal, and generates either an "Up" output signal or a "Down" signal depending on the polarity of the phase comparison.

The "Up" and "Down" signals are applied to a charge pump 16, which applies either a positive or negative current to a capacitor 18 to either increase or decrease a control voltage $V_C$, which is generated across the capacitor 18, respectively. More specifically, the charge pump 16 outputs a positive current to increase the control voltage $V_{ctrl}$ responsive to the "Up" signal, and it outputs a negative current to decrease the control voltage $V_{ctrl}$ responsive to the "Dn" signal.

The control voltage $V_{ctrl}$ is applied to a control input of a voltage controlled delay line "VCDL" 20, which has a clock input receiving the $S_R$ signal. The VCDL 20 delays the $S_R$ signal to provide an output signal $S_{OUT}$, which is coupled to the phase detector 14 as the $S_{FB}$ signal. The magnitude of the delay provided by the VCDL 20 is determined by the magnitude of the control voltage $V_{ctrl}$. More specifically, the magnitude of the delay is inversely proportional to the magnitude of the control voltage $V_{ctrl}$. As a result, the delay of the VCDL 20 decreases responsive to an increase in the magnitude of the control voltage $V_{ctrl}$, and the delay of the VCDL 20 increases responsive to a decrease in the magnitude of the control voltage $V_{ctrl}$.

In operation, the phase detector 14 and charge pump 16 adjust the magnitude of the control voltage $V_{ctrl}$ so that the phase of the $S_{FB}$ signal is substantially equal to the phase of the $S_R$ signal. For example, if the $S_R$ signal leads the $S_{FB}$ signal (i.e., the delay of the VCDL 20 is too large), the phase detector 14 detects the difference in phase and generates an "Up" signal, which causes the charge pump 16 to increase the magnitude of the control voltage $V_{ctrl}$. This increase in the magnitude of the control voltage $V_{ctrl}$ causes the VCDL 20 to reduce the delay of the $S_R$ signal to reduce the phase of the $S_{FB}$ signal. The phase detector 14 and charge pump 16 continue to increase the magnitude of the control voltage $V_{ctrl}$ until the phase of the $S_{FB}$ signal is substantially equal to the phase of the $S_R$ signal. The delay-lock loop 10 operates in an opposite manner if the $S_R$ signal lags the $S_{FB}$ signal (i.e., the delay of the VCDL 20 is too small).

A variety of designs for the phase detector 14 can be used in the delay-lock loop 10. The operation of one commonly used phase detector can be explained with reference to FIG. 2, which shows the reference signal $S_R$ leading the feedback signal $S_{FB}$ derived from the output $S_{OUT}$ signal. In response to the rising edge of the $S_R$ signal, the phase detector 14 generates the "Up" signal, which terminates after a predetermined time delay. Similarly, the phase detector 14 generates the "Down" signal in response to the rising edge of the $S_{FB}$ signal, which terminates at the same time the "Up" signal terminates. The period of time that the "Up" signal is generated but the "Down" signal is not being generated causes a positive current to be applied to the capacitor 18 for the period represented by the shaded area shown in FIG. 2. The positive current increases the control voltage $V_{ctrl}$, which results in the phase of the $S_{FB}$ signal being reduced.

One limitation of the delay-lock loop 10 is the time required for the loop 10 to become "locked," i.e., the phases of the $S_R$ and $S_{FB}$ signals substantially equaling each other. The loop 10 could become locked faster if the magnitude of the control signal $V_{ctrl}$ could be changed either more quickly or to a greater degree. The operation of a phase detector (not shown) that is able to cause the delay-lock loop 10 to lock earlier will be explained with reference to FIG. 3. Like the phase detector explained with reference to FIG. 2, the phase detector generates the "Up" signal responsive to the rising edge of the $S_R$ signal, and it generates the "Down" signal responsive to the rising edge of the $S_{FB}$ signal. However, rather than generating the "Up" and "Down" signals for a fixed period following the first of these signals to be generated, the phase detector generates the "Up" signal until the falling edge of the $S_{FB}$ signal, and it generates the "Down"

signal until the falling edge of the $S_R$ signal. As a result, the period during which the "Up" signal but not the "Down" signal is generated is greatly increased thereby greatly increasing the magnitude of the $V_{ctrl}$ signal, as indicated by the shaded bar in FIG. 3. The increased magnitude of the $V_{ctrl}$ signal causes the delay-lock loop 10 containing the phase detector to achieve lock more rapidly. In the event the $S_R$ signal lags the $S_{FB}$ signal, the phase detector operates in the opposite manner.

Although a phase detector operating as shown in FIG. 3 has the advantage of allowing a locked loop to achieve faster lock time, it has the disadvantage of allowing a fixed phase error between the phase of the $S_R$ signal and the phase of the $S_{FB}$ signal in the event the duty cycle of either the $S_R$ signal or the $S_{FB}$ signal, as will now be explained with reference to FIG. 4. As shown in FIG. 4, the $S_R$ signal lags the $S_{FB}$ signal. As with the example shown in FIG. 3, the "Down" signal is generated on the rising edge of the $S_{FB}$ signal, and the "Up" signal is generated on the rising edge of the $S_R$ signal. The "Down" signal is generated prior to the "Up" signal since the $S_R$ signal lags the $S_{FB}$ signal. The period that the "Down" signal is generated but not the "Up" signal is not generated results in a negative current being applied to the capacitor during the period indicated by the shaded area shown in FIG. 4. As a result, the magnitude of the $V_{ctrl}$ signal is decreased.

The duty cycle of the $S_{FB}$ signal is greater than the 50% duty cycle of the $S_R$ signal. As a result, the $S_R$ signal transitions low before the $S_{FB}$ signal transitions low even though the $S_R$ signal lags the $S_{FB}$ signal. As in the example shown in FIG. 3, the falling edge of the $S_R$ signal terminates the "Down" signal and the falling edge of the $S_{FB}$ signal terminates the "Up" signal. The "Down" signal therefore terminates before the "Up" signal terminates. The period that the "Up" signal continues beyond the termination of the "Down" signal results in a positive current being applied to the capacitor 18 during the period indicated by the shaded area shown in FIG. 4, thereby increasing the magnitude of the $V_{ctrl}$ signal. In fact, the period during which the positive current is applied to the capacitor 18 is equal to the period during which the negative current is applied to the capacitor 18. The net change in the magnitude of the $V_{ctrl}$ signal is therefore zero. Under these circumstances the phase of the $S_{FB}$ signal is not corrected to match the phase of the $S_R$ signal, and the $S_R$ signal continues to lag the $S_{FB}$ signal. The difference in the duty cycle of the $S_{FB}$ signal from the duty cycle of the $S_R$ signal thus results in the maintenance of a permanent phase error between the $S_{FB}$ and the $S_R$ signals. As a result, the $S_{OUT}$ signal generated by the locked loop may not have the proper phase value.

There is therefore a need for a locked loop that is capable of achieving a rapid lock condition without allowing a phase error in the event the duty cycle of a reference signal is not equal to the duty cycle of a feedback signal generated by the locked loop.

SUMMARY OF THE INVENTION

A dual mode phase detector and method includes both a first phase detector and a second phase detector. The first phase detector generates at least one output signal indicative of the phase relationship between a first predetermined transition of a first input signal, such as its rising edge, and the first predetermined transition of a second input signal. The second phase detector generates at least one output signal indicative of both the phase relationship between the first predetermined transition of the first input signal and the first predetermined transition of the second input signal, and the phase relationship between a second predetermined transition of the first input signal, such as its falling edge, and the second predetermined transition of the second input signal. The dual mode phase detector also includes a selector that selects the at least one output signal from the first phase detector if the first and second input signals have a first phase relationship, and it selects the at least one output signal from the second phase detector if the first and second input signals have a second phase relationship that is different from the first phase relationship. The dual-mode phase detector may be used in a locked loop, such as a delay-locked loop. In such case, the dual edge phase detector is used to allow the loop to quickly achieve a locked condition. Thereafter, the single edge phase detector is used so that differences in the duty cycles of the first and second signals do not create fixed phase errors.

DETAILED DESCRIPTION

Figure 5:
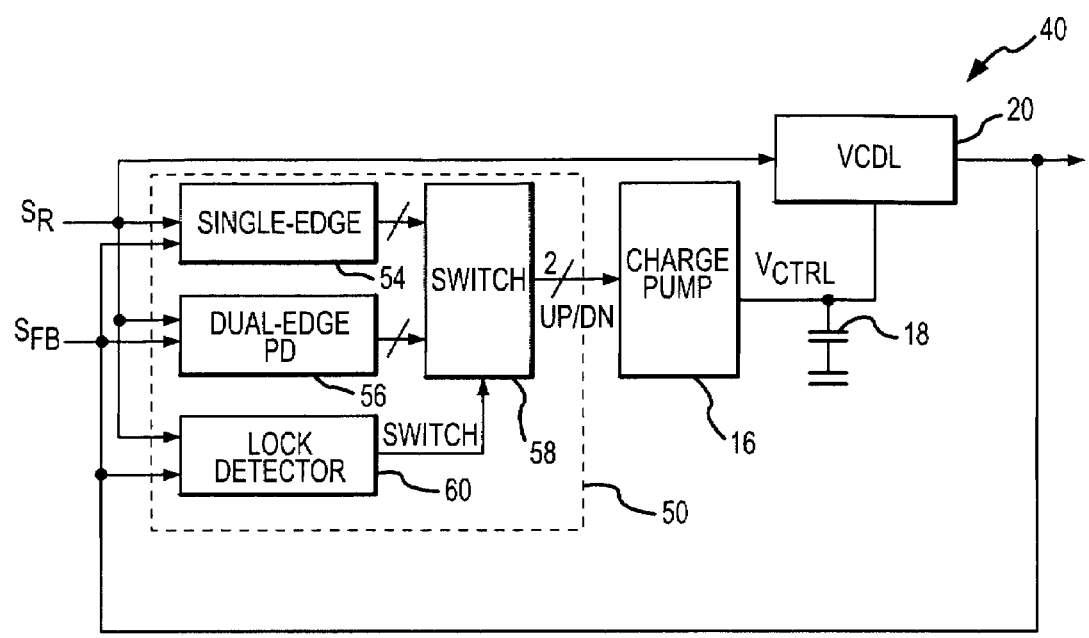
FIG. 5 is a block diagram of a delay-lock loop using a dual mode phase detector according to one example of the present invention.

A delay-lock loop 40 according to one example of the present invention is shown in FIG. 5. The delay-lock loop 40 uses the same charge pump 16, capacitor 18 and VCDL 20 that are used in the delay-lock loop 10 of FIG. 1. These components operate in essentially the same manner in both loops 10, 40. Therefore, in the interests of brevity and clarity, an explanation of their function and operation will not be repeated.

Figure 1:
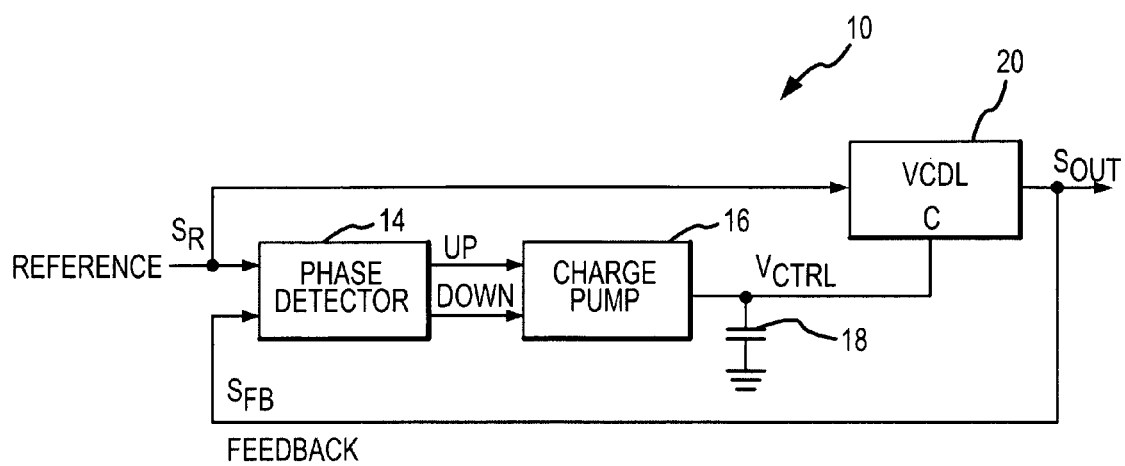
FIG. 1 is a block diagram of a typical delay-lock loop of conventional design.
Figure 2:
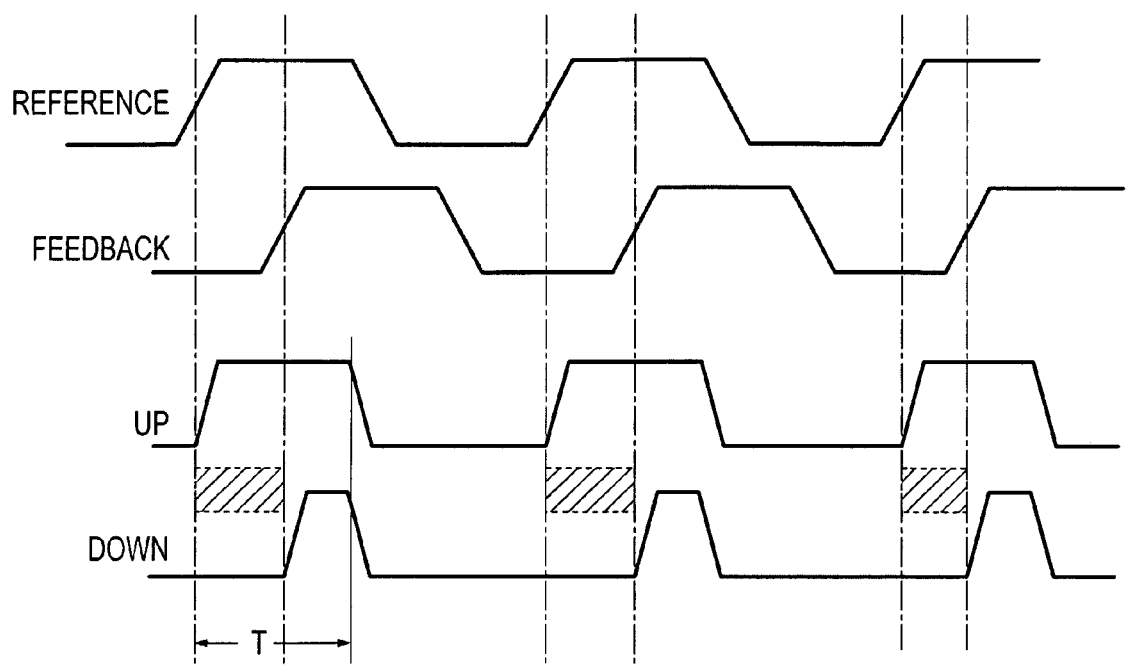
FIG. 2 is a timing diagram illustrating the operation of one example of a phase detector used in the delay-lock loop of FIG. 1.
Figure 3:
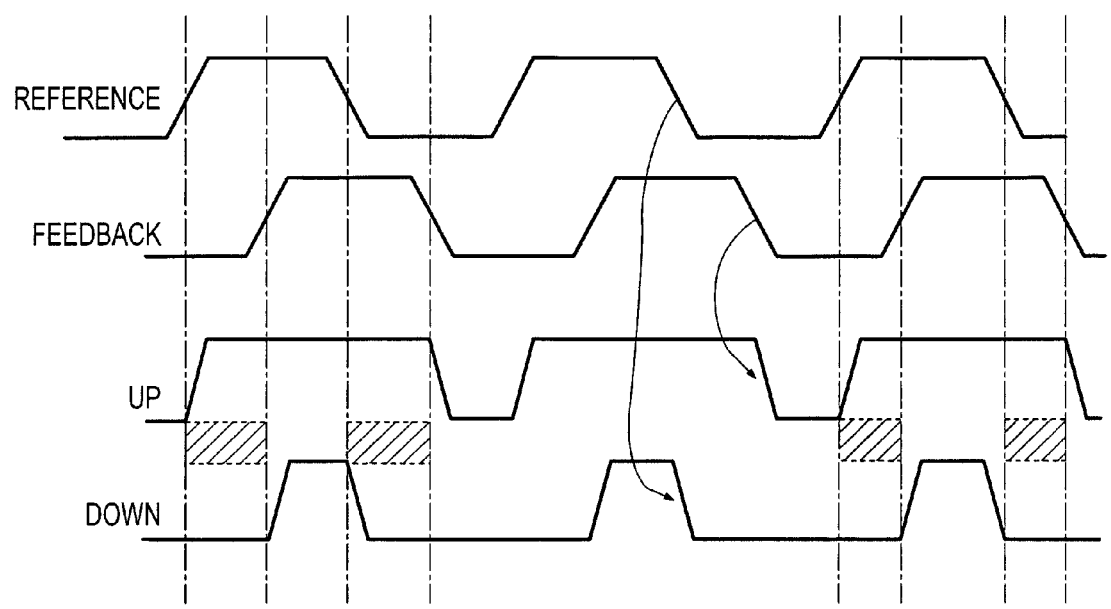
FIG. 3 is a timing diagram illustrating the operation of another example of a phase detector used in the delay-lock loop of FIG. 1, which has the advantage of achieving a locked condition more rapidly.
Figure 4:
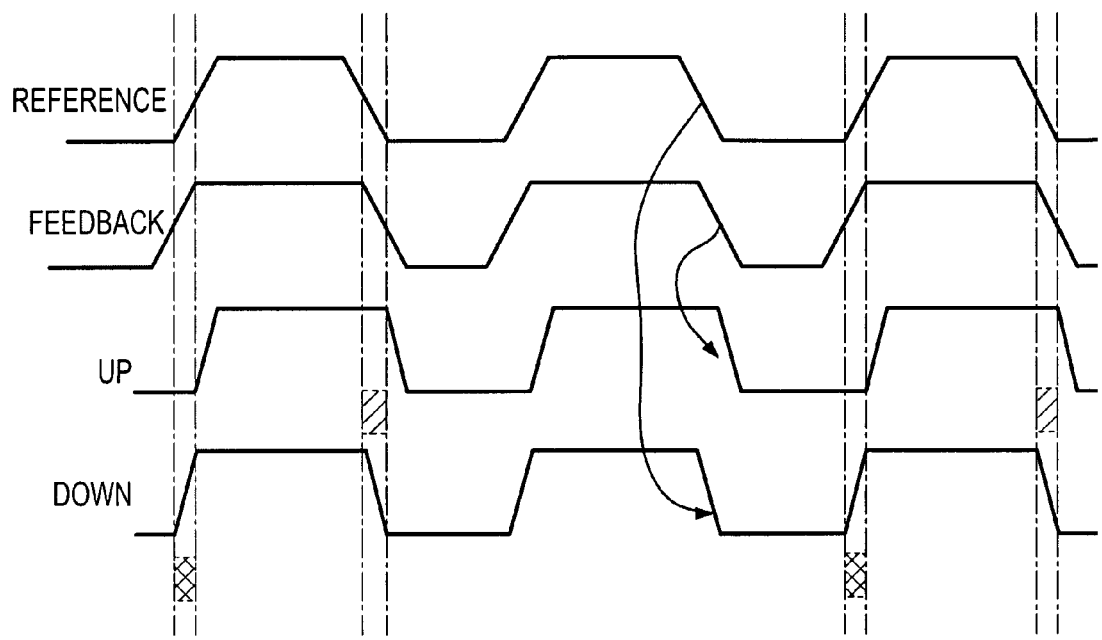
FIG. 4 is a timing diagram illustrating the manner in which the phase detector of FIG. 3 can allow a fixed phase error to exist in the event the duty cycles of the signals applied to the phase detector differ from each other.

The delay-lock loop 40 differs from the delay-lock loop 10 of FIG. 1 in the use of a dual mode phase detector 50. The phase detector 50 includes both a single edge phase detector 54, which operates as shown in FIG. 2, and a dual edge phase detector 56, which operates as shown in FIGS. 3 and 4. Both of the phase detectors 54, 56 receive the reference signal $S_R$ and the feedback signal $S_{FB}$, and they generate the "Up" and "Down" signals in response. The "Up" and "Down" signals are applied to respective inputs of a switch 58. The switch 58 selects the "Up" and "Down" signals produced by one of the phase detectors 54, 56 and couples them to the charge pump 16. The switch 58 is operated by a lock detector 60, which receives the $S_R$ signal and the $S_{FB}$ signal.

In operation, before the lock detector 60 detects a locked condition in which the phase of the $S_R$ signal is within a predetermined range of the $S_{FB}$ signal, the lock detector 60 causes the switch 58 to couple the "Up" and "Down" signals from the dual edge phase detector 56 to the charge pump 16. As explained with reference to FIG. 3, the increased magnitude of the control signal $V_{ctrl}$ resulting from the use of the dual edge phase detector 56 causes the loop 40 to achieve a locked condition relatively quickly. However, as explained with reference to FIG. 4, the dual edge phase detector 56 has the disadvantage of allowing a fixed phase error to exist in the loop 40. This disadvantage is avoided in the phase detector 50 of FIG. 5 by the lock detector 60 detecting the locked condition of the loop 40 and causing the switch 58 to couple the "Up" and "Down" signals from the single edge phase detector 54 to the charge pump 16. As explained above, the use of a signal edge phase detector 54 does not permit the loop 40 to establish a fixed phase error. Therefore, the dual mode phase detector 40 is able to achieve a rapid lock condition without allowing a fixed phase error to exist.

Although the switch 58 used in the dual mode phase detector 50 is shown in FIG. 5 as being a separate component, it may alternatively be incorporated into the charge pump 16. Further, rather than using a switch or similar device to selecting the "Up" and "Down" signals from either the single edge phase detector 54 or the dual edge phase detector 56, the single edge phase detector 54 and the dual edge phase detector 56 may both be coupled to the charge pump 16 at all times. Either the single edge phase detector 54 or the dual edge phase detector 56, but not both, would then be enabled by the lock detector 60 or other device. By way of further example, rather than generating "Up" and "Down" signals, the phase detectors 54, 56 could each generate a signal indicative of the phase relationship between the $S_R$ and $S_{FB}$ signals, thus making the charge pump 16 unnecessary. The switch 58 would then simply select the signal from one of the phase detectors. Other modifications will be apparent to one skilled in the art.

Figure 6:
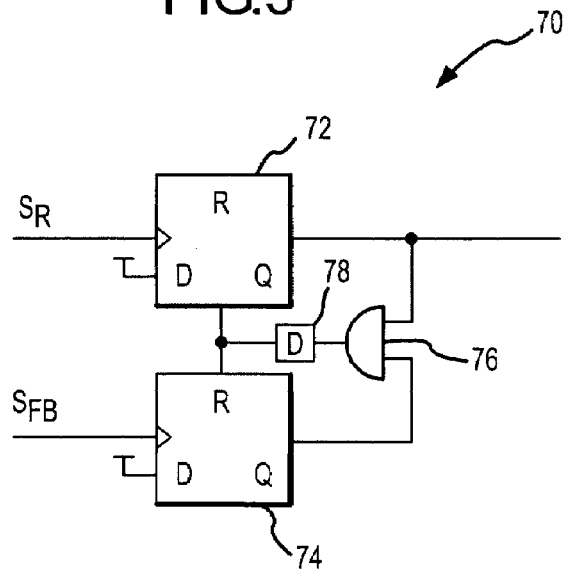
FIG. 6 is a block diagram of an example of a single edge phase detector that may be used in the dual mode phase detector of FIG. 5.

One example of a single edge phase detector 70 that may be used as the single edge phase detector 54 of FIG. 5 is shown in FIG. 6. With reference to FIG. 6, the phase detector 70 includes a first flip-flop 72 having its data input biased high and its clock input coupled to receive the $S_R$ signal. Therefore, the Q output of the flip-flop 72 transitions high responsive to the rising edge of the $S_R$ signal to generate the "Up" signal. The phase detector 70 also includes a second flip-flop 74, which has its data input biased high and its clock input coupled to receive the $S_{FB}$ signal. Therefore, the Q output of the flip-flop 74 transitions high responsive to the rising edge of the $S_{FB}$ signal to generate the "Down" signal. However, the Q outputs of the flip-flops 72, 74 are also applied to respective inputs of an AND gate 76 so that the output of the AND gate transitions high when both the $S_R$ and the $S_{FB}$ signal have transitioned high. The high output of the AND gate 76 resets the flip-flops 72, 74 when both the $S_R$ and the $S_{FB}$ signal have transitioned high. Therefore, if the $S_R$ signal leads the $S_{FB}$ signal, the "Up" signal will be generated until the $S_{FB}$ signal transitions high, but no "Down" signal will be generated. Conversely, if the $S_{FB}$ signal leads the $S_R$ signal, the "Down" signal will be generated until the $S_R$ signal transitions high, but no "Up" signal will be generated.

In practice, the output of the AND gate 76 is coupled to the reset inputs of the flip-flops 72, 74 through a delay circuit 78. The delay circuit delays the termination of the "Up" and "Down" signals for a short period after the later generated of the "Up" and "Down" signals is generated. As a result, if the $S_R$ signal leads the $S_{FB}$ signal, the "Down" signal will be generated for a short period in addition to the "Up" signal being generated for a longer period. If the $S_{FB}$ signal leads the $S_R$ signal, the "Up" signal will be generated for a short period in addition to the "Down" signal being generated for a longer period. If the $S_R$ signal has the same phase as the $S_{FB}$ signal, i.e., the loop 40 is locked, a short "Up" signal and a short "Down" signal of equal duration will be generated. By generating short "Up" and "Down" signals even when the loop 40 is locked or nearly locked, any "dead band" in the operation of the loop 40 when the loop 40 is locked is avoided. Without the use of the delay circuit 78, a small difference between the phases of the $S_R$ and $S_{FB}$ signals might not result in a control signal $V_{ctrl}$ being generated so that this phase difference would continue to exist.

Figure 7:
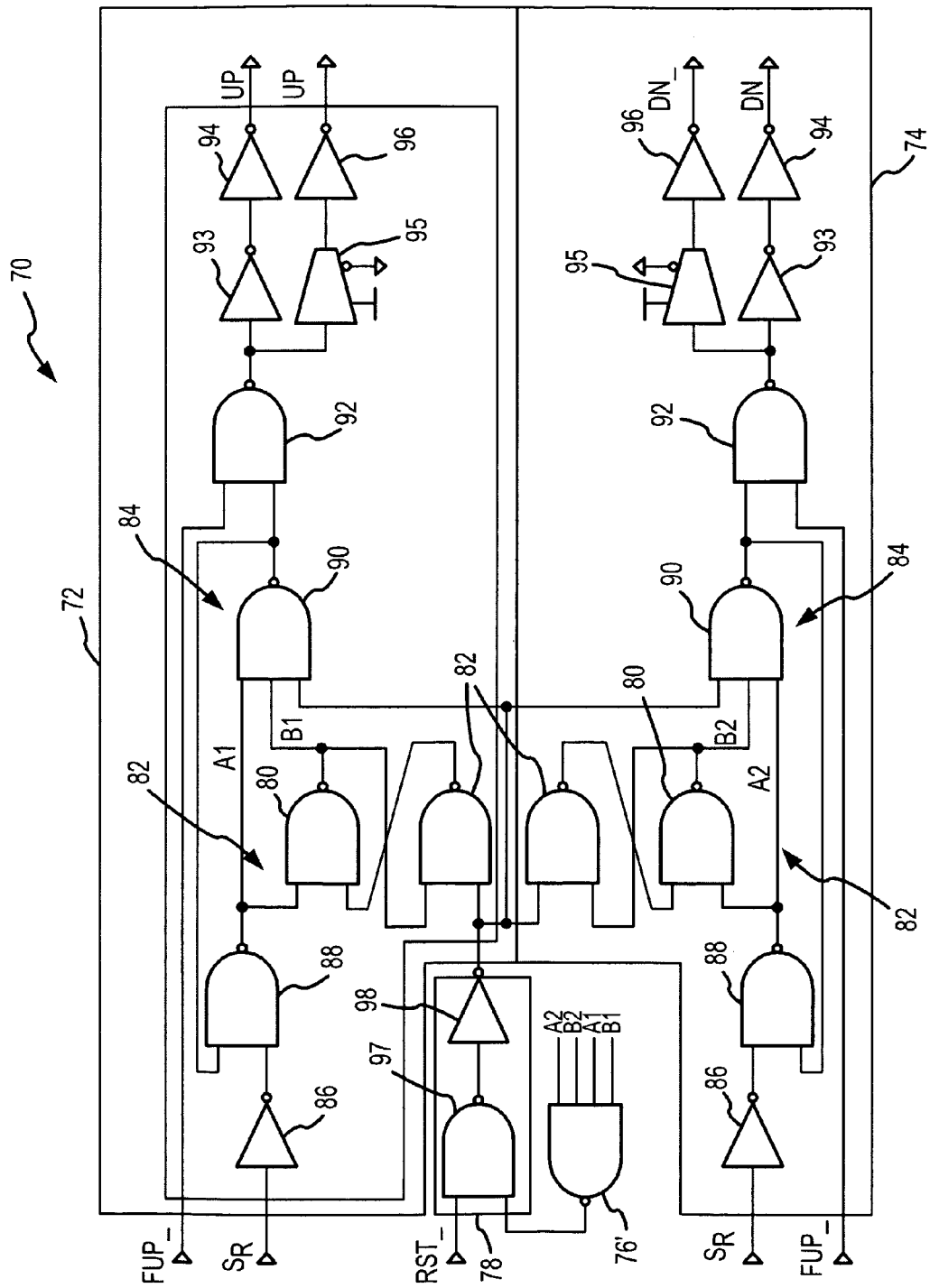
FIG. 7 is a logic diagram of an example of a single edge phase detector that may be used as the single edge phase detector of FIG. 6.

One example of the single edge phase detector 70' is shown in FIG. 7. The first and second flip-flops 72, 74 of the phase detector 70' are implemented by respective circuits 72', 74' that are identical to each other. The first circuit 72' includes a flip-flop 82 formed by a pair of cross-coupled NAND gates 80, 82. The $S_R$ signal is applied to the NAND gate 80 through an inverter 86 and a NAND gate 88. Prior to the rising edge of the $S_R$ signal, the NAND gate 88 is enabled so that the low $S_R$ signal causes the NAND gate 88 to output a low A1 signal. The low A1 signal resets the flip-flop 82 so that the B1 output of the NAND gate 80 is high. The high at the output of the NAND gate 80 is applied to a NAND gate 90, which implements a second flip-flop 84 in combination with the NAND gate 88. The high at the output of the NAND gate 90 is also applied to an input of a NAND gate 92, which then outputs a low since the other input of the NAND gate 92 normally receives an inactive high FUP signal. This low is applied through a pair of inverters 93, 94 to generate an inactive low "Up" signal and it is applied through a pass gate 95 and an inverter 96 to generate an inactive high "Up_" signal. Thus, prior to the rising edge of the $S_R$ signal, the A1 signal is low and the B1 signal is high.

In response to the rising edge of the $S_R$ signal, the output of the inverter 86 transitions low thereby setting the flip-flop 84, which causes the A1 signal at the output of the NAND gate 88 to transition high. As explained above, the B1 signal will also be high at this time, and, as will be explained below, the third input of the NAND gate 90 is high whenever the flip-flop 82 is not being reset. As a result, the output of the NAND gate 90 transitions low, thereby causing the NAND gate 92 to output a high. The "Up" and "Up_" signals then become active high and low, respectively. Thus, the "Up" and "Up_" signals become active responsive to the rising edge of the $S_R$ signal. The low at the output of the NAND gate 90 also disables the NAND gate 88. However, the A1 signal at the output of the NAND gate remains high since the $S_R$ signal has transitioned high. Thus, after the rising edge of the $S_R$ signal, both the A1 signal and the B1 signal are high.

As previously mentioned, the circuit 74' contains the same components as the circuit 72', and they operate in the same manner to generate active "Down" and "Down_" signals responsive to the rising edge of the $S_{FB}$ signal. Therefore, in the interest of brevity, and explanation of the operation of the circuit 74' will not be repeated.

The function of the delay circuit 78 (FIG. 6) is performed by a NAND gate 97 and inverter 98. When the later of the rising edge of the $S_R$ signal or the rising edge of the $S_{FB}$ signal occurs and the output of the NAND gate 76' transitions low, the resetting of the flip-flops 72, 74 is delayed by the propagation delay of the NAND gate 96 and inverter 98 so that short "Up" and "Down" signals are generated when the phase of the $S_R$ signal is equal to the phase of the $S_{FB}$ signal, as previously explained.

The reset function of the AND gate 72 (FIG. 6) is performed by a NAND gate 76' that receives A1 and A2 signals from the outputs of each of the NAND gates 88 in the circuits 72', 74', respectively. As previously explained, these signals transition high responsive to the rising edges of the $S_R$ and $S_{FB}$ signals, respectively. The NAND gate 76 also receives B1 and B2 signals from the outputs of the NAND gate 80 in each of the circuits 72', 74', respectively. When the rising edges of both the $S_R$ and $S_{FB}$ signals has occurred, the A1, A2, B1 and B2 signals are all high. As a result, the NAND gate 76' outputs a low reset signal.

When the reset signal is generated, the low at the output of the NAND gate 76' causes the output of the inverter 98 to output a low. This low resets the flip flop 82, thereby causing the NAND gate 82 to output a high. Since the A1 signal is still high at that time, the B1 signal at the output of the NAND gate 80 transitions low. The low B1 signal causes the output of the NAND gate 90 to go high, thereby terminating the active "Up" and "Up_" signals. However, the low signal at the output of the NAND gate 90 does not cause the output of the NAND gate 88 to change since the other input of the NAND gate 88 is still low because the $S_R$ signal is still high. As are result, the A1 signal remains high.

When the B1 and B2 signals transition low responsive to the reset signal, the reset signal generated by the NAND gate 76' terminates, thereby causing the output of the inverter 98 to transition high. However, this transition has no effect on the circuit other than to enable the NAND gates 82, 90 since the low B1 signal continues to make the outputs of the NAND gates 82, 90 high.

Before the next rising edge of the SR signal, the SR signal transitions low. Since the NAND gate 88 is enabled by the low B1 signal applied to the input of the NAND gate 90, the A1 signal at the output of the NAND gate 88 transitions low. The low A1 signal resets the flip-flop 84, and it sets the flip-flop 82 thereby making the B1 signal high. However, the output of the NAND gate 90 remains high because of the low A1 signal. As a result, the "Up" and "Up_" signals remain inactive. Thus, after the $S_R$ and $S_{FB}$ signals have transitioned low, the A1 signal is low and the B1 signal is high, which are the initial conditions used in the previous explanation of the operation of the circuit 72' responsive to the rising edge of the $S_R$ signal.

Figure 8:
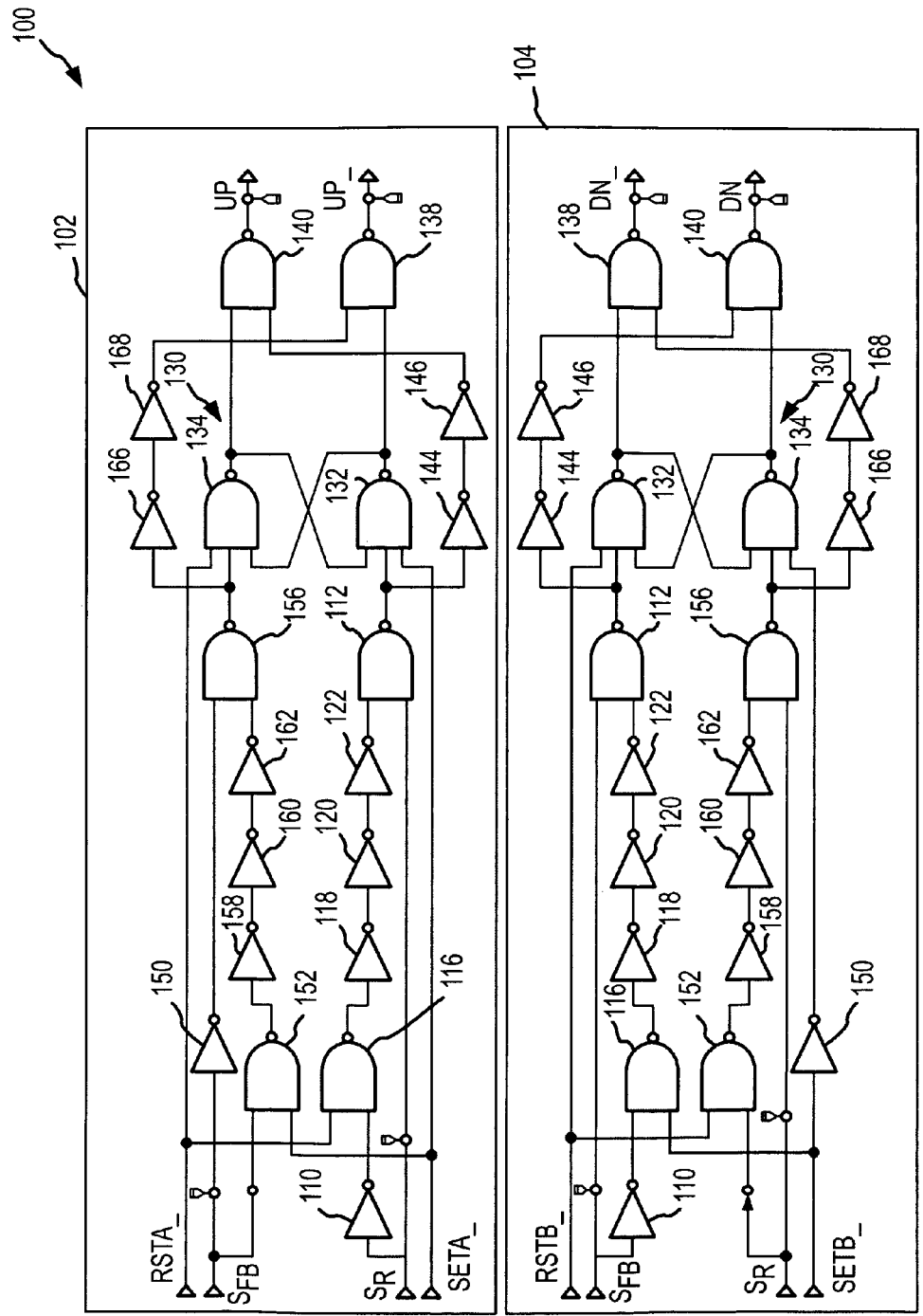
FIG. 8 is a logic diagram of an example of a dual edge phase detector that may be used in the dual mode phase detector of FIG. 5.

One example of a dual edge phase detector 100 that may be used as the dual edge phase detector 56 (FIG. 5) is shown in FIG. 8. The phase detector 100 includes two identical detector circuits 102, 104. The detector circuit 102 generates the "Up" and "Up_" signals responsive to the rising edge of the $S_R$ signal for a period that is terminated by the falling edge of the $S_{FB}$ signal. The detector circuit 102 also receives an active low reset signal RSTA_ and an active low set signal SETA_, which are normally high. The $S_R$ signal is applied to an inverter 110 and one input of a NAND gate 112. The other input of the NAND gate 112 receives the $S_R$ signal through an enabled NAND gate 116 and three inverters 118, 120, 122. Prior to the rising edge of the $S_R$ signal, the inverter 122 applies a high to the input of the NAND gate 112. Therefore, when the $S_R$ signal transitions high, both inputs of the NAND gate 112 are initially high thereby causing the NAND gate 112 to output a low. However, after a period corresponding to the propagation delays of the NAND gate 116 and the inverters 118, 120, 122, the output of the inverter 122 transitions low thereby causing the output of the NAND gate 112 to transition high. As a result, the NAND gate 112 outputs a short negative-going pulse responsive to the rising edge of the $S_R$ signal.

The negative-going pulse occurring on the rising edge of the $S_R$ signal sets a flip-flop 130 formed by a pair of NAND gates 132, 134. The NAND gate 132 then outputs a high, which is applied to a NAND gate 138. As will be explained below, the NAND gate 132 is enabled at all times except for a short period after the falling edge of the $S_{FB}$ signal. Therefore, an active low "Up_" signal is generated at the output of the NAND gate 138. Similarly, the NAND gate 134 outputs low, which is applied to a NAND gate 140. The NAND gate 140 is enabled through a pair of inverters 144, 146 by the high at the output of the NAND gate 112 at all times other than for a short period after the rising edge of the $S_R$ signal, as previously explained. As a result, the NAND gate 140 outputs an active high "Up" signal.

The flip-flop 130 is reset by a circuit that is similar to the circuit that is used to set the flip-flop 130. An inverter 150 and a NAND gate 152 receive a $S_{FB}$ signal (which is the compliment of the $S_{FB}$ signal). The output of the inverter 150 is coupled to one input of a NAND gate 156, and the output of the NAND gate 152 is coupled to the other input of the NAND gate 156 through a series of inverters 158, 160, 162. As a result, in response to the falling edge of the $S_{FB}$ signal, the NAND gate 156 outputs a short negative-going pulse, which resets the flip-flop 130. The output of the NAND gate 156 is high at all other times to enable the NAND gate 138 through a pair of inverters 166, 168. When the flip-flop 130 is reset responsive to the falling edge of the $S_{FB}$ signal, the active "Up" and Up_" signals terminate. In summary, the "Up" and Up_" signals become active a short time after the rising edge of the $S_R$ signal, and they become inactive a short time after the falling edge of the $S_{FB}$ signal. The flip-flop 130 may also be set to make the "Up" and "Up_" signals active by driving the SETA_signal active low, and it may be reset to make the "Up" and "Up_" signals inactive by driving the RSTA_ signal active low.

The detector circuit 104 operates in the same manner as the detector circuit 102 to make the "Down" and Down_" signals active a short time after the rising edge of the $S_{FB}$ signal, and to make the "Down" and Down_" signals inactive a short time after the falling edge of the $S_R$ signal. Again, the "Down" and Down_" may also be made active by driving the SETB_ signal active low, and they may be made inactive by driving the RSTB_ signal active low.

Delay-lock loops using dual mode phase detectors according to various embodiments of the present invention can be used for a variety of purposes in electronic devices, such as in memory devices. For example, with reference to FIG. 9, a synchronous dynamic random access memory ("SDRAM") 200 includes a command decoder 204 that controls the operation of the SDRAM 200 responsive to high-level command signals received on a control bus 206 and coupled through input receivers 208. These high level command signals, which are typically generated by a memory controller (not shown in FIG. 9), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally coupled through input receiver 210 and then applied to a memory controller (not shown in FIG. 9). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248.

Data to be read from one of the arrays 220, 222 is coupled to the column circuitry 254, 255 for one of the arrays 220, 222, respectively. The data is then coupled through a data output register 256 and data output drivers 257 to a data bus 258. The data output drivers 257 apply the read data to the data bus 258 responsive to a read data strobe signal $S_R$ generated by a a delay-lock loop using a dual mode phase detector in accordance with various examples of the present invention. The delay-lock loop receives a periodic iCLK signal and generates the read data strobe $S_R$ responsive thereto. As a result, the read data are coupled to the data bus 258 substantially in phase with the iCLK signal.

Data to be written to one of the arrays 220, 222 are coupled from the data bus 258 through data input receivers 261 to a data input register 260. The data input receivers 261 couple the write data from the data bus 258 responsive to a write data strobe signal $S_W$. The write data strobe signal $S_W$ is also generated by a delay-lock loop using a dual mode phase detector in accordance with various embodiments of the present invention. The delay-lock loop receives the periodic iCLK signal and generates the write data strobe signal $S_W$ responsive thereto. Using known techniques, the delay-lock loop may generate the write data strobe signal $S_W$ in quadrature with the iCLK signal. As a result, the write data are coupled to the data bus 258 at a predetermined phase relative to the phase of the iCLK signal. The write data are coupled to the column circuitry 254, 255 where they are transferred to one of the arrays 220, 222, respectively. A mask register 264 responds to a data mask DM signal to selectively alter the flow of data into and out of the column circuitry 254, 255, such as by selectively masking data to be read from the arrays 220, 222.

Figure 9:
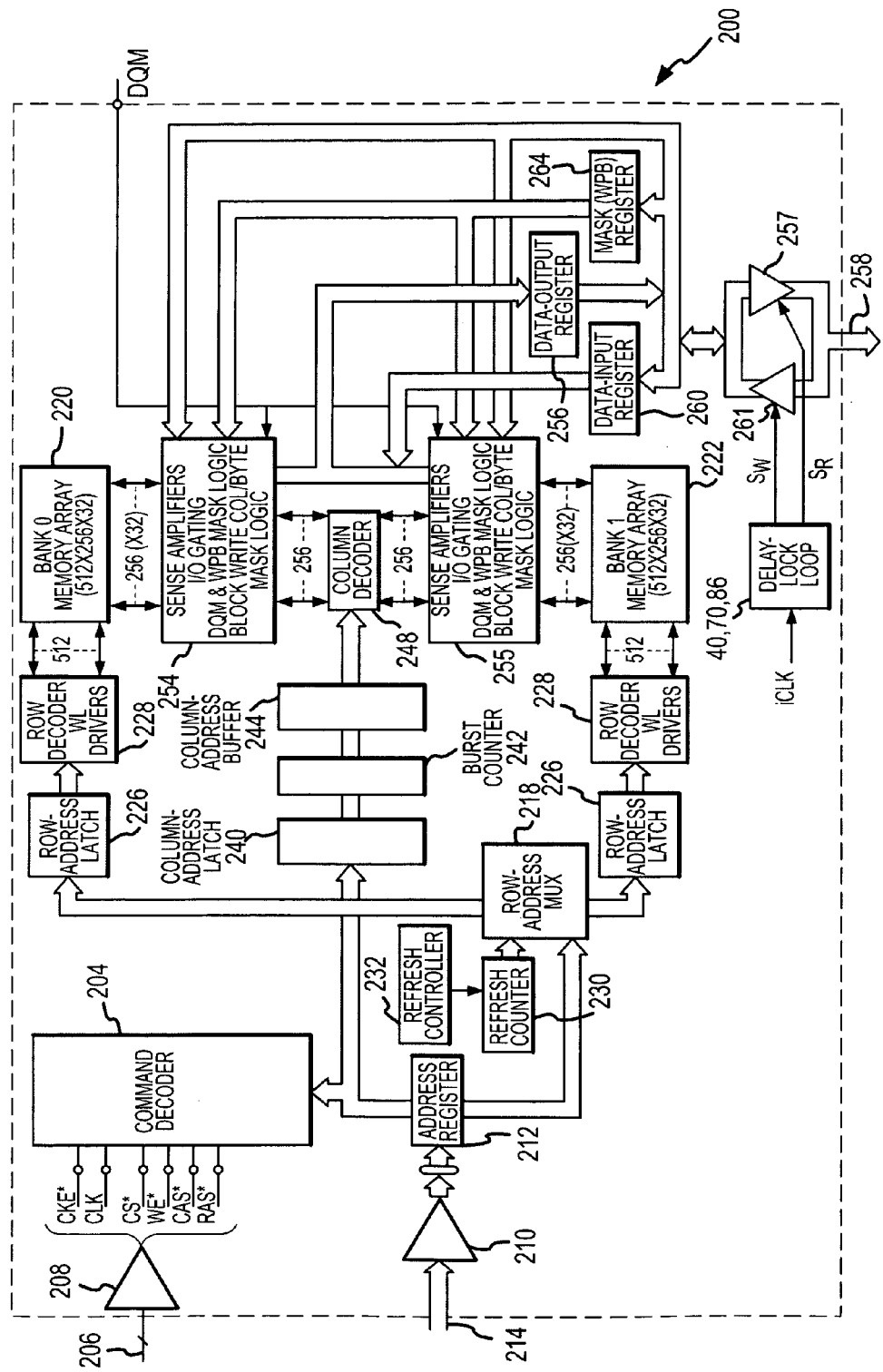
FIG. 9 is a block diagram of a memory device using an output signal generated by a delay-lock loop using the dual mode phase detector of FIG. 5 or some other embodiment of the invention.
Figure 10:
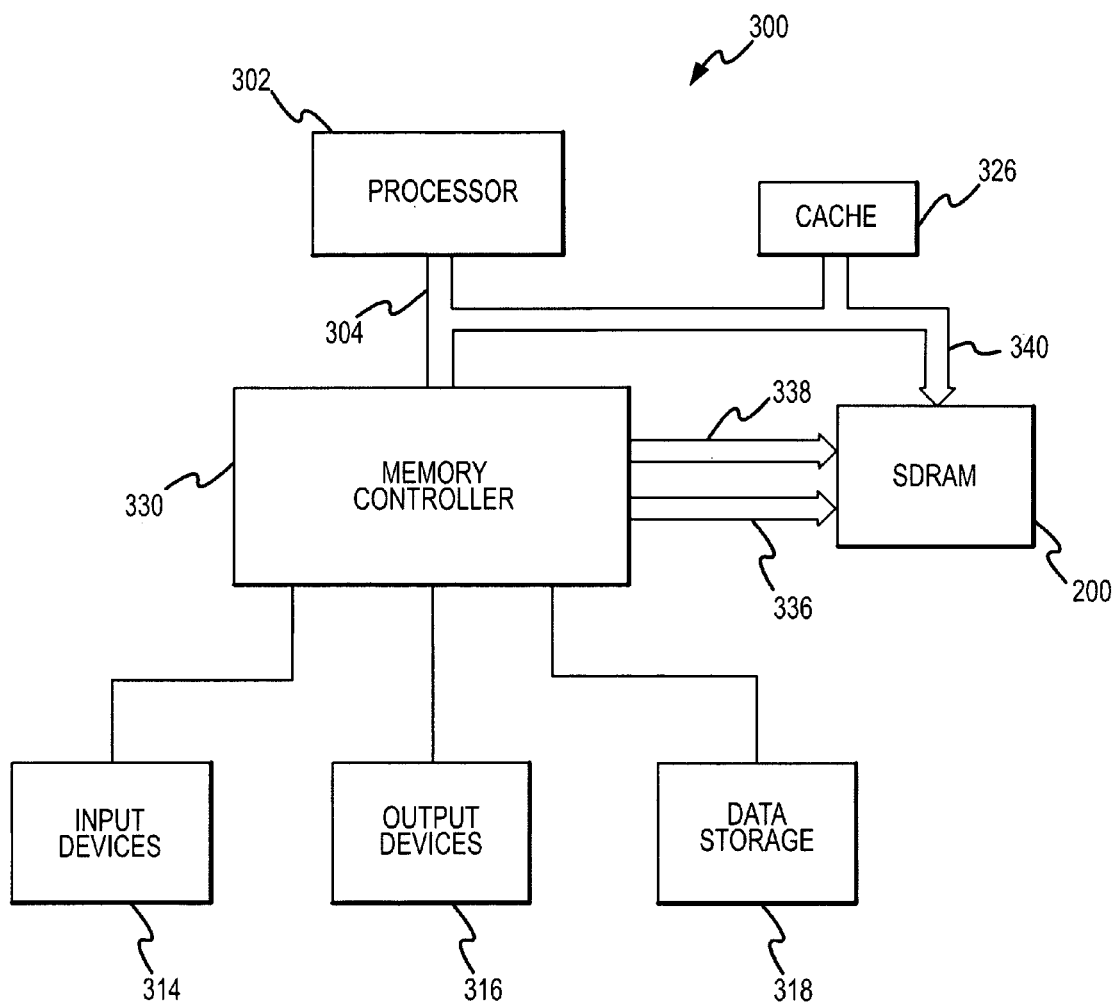
FIG. 10 is a block diagram of a processor-based system using the memory device of FIG. 9.

The SDRAM 200 shown in FIG. 9 can be used in various electronic systems. For example, it may be used in a processor-based system, such as a computer system 300 shown in FIG. 10. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 200 through a memory controller 330. The memory controller 330 normally includes a control bus 336 and an address bus 338 that are coupled to the SDRAM 200. A data bus 340 is coupled from the SDRAM 200 to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A dual mode phase detector, comprising:
a single-edge first phase detector receiving first and second input signals and generating at least one output signal indicative of only a phase relationship between a first predetermined transition of the first input signal and the first predetermined transition of the second input signal, the first predetermined transition being a transition from a first logic level to a second logic level;
a dual-edge second phase detector receiving the first and second input signals and generating at least one output signal, the at least one output signal being indicative of both a phase relationship between the first predetermined transition of the first input signal and the first predetermined transition of the second input signal and a phase relationship between a second predetermined transition of the first input signal and the second predetermined transition of the second input signal, the second predetermined transition being a transition from the second logic level to the first logic level; and
a selector selecting the at least one output signal from the first phase detector if the first and second input signals have a first phase relationship and selecting the at least one output signal from the second phase detector if the first and second input signals have a second phase relationship that is different from the first phase relationship.

2. The dual mode phase detector of claim 1 wherein the at least one output signal from the first phase detector comprises a first output signal generated if the first predetermined transition of the first input signal leads the first predetermined transition of the second input signal and a second output signal generated if the first predetermined transition of the first input signal lags the first predetermined transition of the second input signal.

3. The dual mode phase detector of claim 2 wherein the at least one output signal from the second phase detector comprises a first output signal generated if the first predetermined transition of the first input signal leads the first predetermined transition of the second input signal and if the second predetermined transition of the first input signal leads the second predetermined transition of the second input signal, the at least one output signal from the second phase detector further comprising a second output signal generated if the first predetermined transition of the first input signal lags the first predetermined transition of the second input signal and if the second predetermined transition of the first input signal lags the second predetermined transition of the second input signal.

4. The dual mode phase detector of claim 1 wherein the first phase relationship comprises the difference between the phase of the first input signal and the phase of the second input signal being less than a predetermined value.

5. The dual mode phase detector of claim 1 wherein the first logic level is a logic "0" logic level and the second logic level is a logic "1" logic level so that the first predetermined transition of the first and second input signals comprises a rising edge transition of the first and second input signals and the second predetermined transition of the first and second input signals comprises a falling edge transition of the first and second input signals.

6. The dual mode phase detector of claim 1 wherein the selector comprises a switch that receives the at least one output signal from the first phase detector and the at least one output signal from the second phase detector, the switch being operable to couple the at least one output signal from the first phase detector to at least one output terminal if the first phase detector is selected and to couple the at least one output signal from the second phase detector to the at least one output terminal if the second phase detector is selected.

7. A dual mode phase detector, comprising:
a single-edge first phase detector receiving first and second input signals, the first phase detector generating a first output signal if a first predetermined transition of the first input signal leads the first predetermined transition of the second input signal, the first phase detector generating a second output signal if the first predetermined transition of the first input signal lags the first predetermined transition of the second input signal, the first predetermined transition being a transition from a first logic level to a second logic level;
a dual-edge second phase detector receiving the first and second input signals, the second phase detector generating a first output signal if a first predetermined transition of the first input signal leads the first predetermined transition of the second input signal and if a second predetermined transition of the first input signal leads the second predetermined transition of the second input signal, the second phase detector generating a second output signal if the first predetermined transition of the first input signal lags the first predetermined transition of the second input signal and if the second predetermined transition of the first input signal lags the second predetermined transition of the second input signal, the second predetermined transition being a transition from the second logic level to the first logic level; and
a selector selecting the first phase detector if the first and second input signals have a first phase relationship and selecting the second phase detector if the first and second input signals have a second phase relationship that is different from the first phase relationship.

8. The dual mode phase detector of claim 7 wherein the first phase relationship comprises the difference between the phase of the first input signal and the phase of the second input signal being less than a predetermined value.

9. The dual mode phase detector of claim 7 wherein the first logic level is a logic "0" logic level and the second logic level is a logic "1" logic level so that the first predetermined transition of the first and second input signals comprises a rising edge transition of the first and second input signals and the second predetermined transition of the first and second input signals comprises a falling edge transition of the first and second input signals.

10. The dual mode phase detector of claim 7 wherein the selector comprises a switch that receives the first and second output signals from the first phase detector and the first and second output signals from the second phase detector, the switch being operable to couple either the first and second output signals from the first phase detector or the first and second output signals from the second phase detector to respective output terminals.

11. A delay-lock loop generating an output signal having a controlled phase relative to the phase of a reference signal, the delay-lock loop comprising:
a delay line receiving the reference signal and delaying the reference signal to generate the output signal, the delay of the output signal relative to the reference signal corresponding to a control signal;
a single-edge first phase detector receiving the reference signal and a feedback signal corresponding to the output signal and generating at least one output signal indicative of only a phase relationship between a first predetermined transition of the reference signal and the first predetermined transition of the feedback signal, the first predetermined transition being a transition from a first logic level to a second logic level;
a dual-edge second phase detector receiving the reference signal and the feedback signal and generating at least one output signal, the at least one output signal being indicative of both a phase relationship between the first predetermined transition of the reference signal and the first predetermined transition of the feedback signal and a phase relationship between a second predetermined transition of the reference signal and the second predetermined transition of the feedback signal, the second predetermined transition being a transition from the second logic level to the first logic level; and
a selector coupled to the first and second phase detectors and the delay line, the selector being operable to select the at least one output signal from the first phase detector for use as the control signal if the reference signal and the feedback signal have a first phase relationship and to select the at least one output signal from the second phase detector for use as the control signal if the reference signal and the feedback signal have a second phase relationship that is different from the first phase relationship.

12. The delay-lock loop of claim 11 wherein the at least one output signal from the first phase detector comprises at least one signal that decreases the delay of the delay line if the first predetermined transition of the reference signal leads the first predetermined transition of the feedback signal and that increases the delay of the delay line if the first predetermined transition of the reference signal lags the first predetermined transition of the feedback signal.

13. The delay-lock loop of claim 12 wherein the at least one output signal from the second phase detector comprises at least one output signal that decreases the delay of the delay line if the first predetermined transition of the reference signal leads the first predetermined transition of the feedback signal and if the second predetermined transition of the reference signal leads the second predetermined transition of the feedback signal, the least one output signal increasing the delay of the delay line if the first predetermined transition of the reference signal lags the first predetermined transition of the feedback signal and if the second predetermined transition of the reference signal lags the second predetermined transition of the feedback signal.

14. The delay-lock loop of claim 11 wherein the at least one output signal from the first phase detector comprises a first output signal generated if a first predetermined transition of the reference signal leads the first predetermined transition of the feedback signal and a second output signal generated if the first predetermined transition of the reference signal lags the first predetermined transition of the feedback signal.

15. The delay-lock loop of claim 14 wherein the at least one output signal from the second phase detector comprises a first output signal generated if the first predetermined transition of the reference signal leads the first predetermined transition of the feedback signal and if the second predetermined transition of the reference signal leads the second predetermined transition of the feedback signal, the at least one output signal from the second phase detector further comprising a second output signal generated if the first predetermined transition of the reference signal lags the first predetermined transition of the feedback signal and if the second predetermined transition of the reference signal lags the second predetermined transition of the feedback signal.

16. The delay-lock loop of claim 15, further comprising:
a capacitor; and
a charge pump coupled to the selector to receive the first and second output signals selected by the selector, the charge pump being coupled to the capacitor and being operable to apply current to the capacitor having a first polarity responsive to the first output signal and being operable to apply current to the capacitor having a second polarity that is different from the first polarity responsive to the second output signal.

17. The delay-lock loop of claim 11 wherein the first phase relationship comprises the difference between the phase of the reference signal and the phase of the feedback signal being less than a predetermined value.

18. The delay-lock loop of claim 17 wherein the first phase relationship comprises a phase relationship between the phase of the reference signal and the phase of the feedback signal indicative of the delay-lock loop being in a locked condition.

19. The delay-lock loop of claim 11 wherein the first logic level is a logic "0" logic level and the second logic level is a logic "1" logic level so that the first predetermined transition of the reference signal and feedback signal comprises a rising edge transition of the reference signal and the feedback signal and the second predetermined transition of the reference signal and the feedback signal comprises a falling edge transition of the reference signal and the feedback signal.

20. The delay-lock loop of claim 11 wherein the selector comprises a switch having at least one first input terminal that receives the at least one output signal from the first phase detector and at least one second input terminal that receives the at least one output signal from the second phase detector, the switch being operable to couple the at least one first input terminal to at least one output terminal if the first phase detector is selected, the switch further being operable to couple the at least one second input terminal to at the least one output terminal if the second phase detector is selected, the at least one output terminal being coupled to at least one control input of the delay line.

21. A memory device, comprising:
a row address circuit operable to receive and decode row address signals applied to external address terminals of the memory device;
a column address circuit operable to receive and decode column address signals applied to the external address terminals;
a memory cell array operable to store data written to and read from the array at a location determined by the decoded row address signals and the decoded column address signals;
a read data path circuit operable to couple read data signals from the memory cell array to external data terminals of the memory device, the read data signals being applied to the external data terminals responsive to a read data strobe signal;
a write data path circuit operable to couple write data signals from the external data terminals of the memory device responsive to a write data strobe signal, the write data signals being coupled to the memory cell array;
a command decoder operable to decode a plurality of command signals applied to respective external command terminals of the memory device, the command decoder being operable to generate control signals corresponding to the decoded command signals; and
a delay-lock loop operable to generate either the write data strobe signal or the read data strobe signal from an internal clock signal, the delay-lock loop comprising:
a delay line receiving the internal clock signal and delaying the internal clock signal to generate an output signal for use as either the write data strobe signal or the read data strobe signal, the delay of the output signal generated by the delay line relative to the internal clock signal corresponding to a control signal;
a single-edge first phase detector receiving the internal clock signal and the output signal from the delay line and generating at least one output signal indicative of only a phase relationship between a first predetermined transition of the internal clock signal and the first predetermined transition of the output signal from the delay line, the first predetermined transition being a transition from a first logic level to a second logic level;
a dual-edge second phase detector receiving the internal clock signal and the output signal from the delay line and generating at least one output signal, the at least one output signal being indicative of both a phase relationship between the first predetermined transition of the internal clock signal and the first predetermined transition of the output signal from the delay line and a phase relationship between a second predetermined transition of the internal clock signal and the second predetermined transition of the output signal from the delay line, the second predetermined transition being a transition from the second logic level to the first logic level; and
a selector coupled to the first and second phase detectors and the delay line, the selector being operable to select the at least one output signal from the first phase detector for use as the control signal if the internal clock signal and the output signal from the delay line have a first phase relationship and to select the at least one output signal from the second phase detector for use as the control signal if the internal clock signal and the output signal from the delay line have a second phase relationship that is different from the first phase relationship.

22. The memory device of claim 21 wherein the at least one output signal from the first phase detector comprises at least one signal that decreases the delay of the delay line if the first predetermined transition of the internal clock signal leads the first predetermined transition of the output signal from the delay line and that increases the delay of the delay line if the first predetermined transition of the internal clock signal lags the first predetermined transition of the output signal from the delay line.

23. The memory device of claim 22 wherein the at least one output signal from the second phase detector comprises at least one output signal that decreases the delay of the delay line if the first predetermined transition of the internal clock signal leads the first predetermined transition of the output signal from the delay line and if the second predetermined transition of the internal clock signal leads the second predetermined transition of the output signal from the delay line, the least one output signal increasing the delay of the delay line if the first predetermined transition of the internal clock signal lags the first predetermined transition of the output signal from the delay line and if the second predetermined transition of the internal clock signal lags the second predetermined transition of the output signal from the delay line.

24. The memory device of claim 21 wherein the at least one output signal from the first phase detector comprises a first output signal generated if a first predetermined transition of the internal clock signal leads the first predetermined transition of the output signal from the delay line and a second output signal generated if the first predetermined transition of the internal clock signal lags the first predetermined transition of the output signal from the delay line.

25. The memory device of claim 24 wherein the at least one output signal from the second phase detector comprises a first output signal generated if the first predetermined transition of the internal clock signal leads the first predetermined transition of the output signal from the delay line and if the second predetermined transition of the internal clock signal leads the second predetermined transition of the output signal from the delay line, the at least one output signal from the second phase detector further comprising a second output signal generated if the first predetermined transition of the internal clock signal lags the first predetermined transition of the output signal from the delay line and if the second predetermined transition of the internal clock signal lags the second predetermined transition of the output signal from the delay line.

26. The memory device of claim 25, further comprising:
a capacitor; and
a charge pump coupled to the selector to receive the first and second output signals selected by the selector, the charge pump being coupled to the capacitor and being operable to apply current to the capacitor having a first polarity responsive to the first output signal and being operable to apply current to the capacitor having a second polarity that is different from the first polarity responsive to the second output signal.

27. The memory device of claim 21 wherein the first phase relationship comprises the difference between the phase of the internal clock signal and the phase of the output signal from the delay line being less than a predetermined value.

28. The memory device of claim 27 wherein the first phase relationship comprises a phase relationship between the phase of the internal clock signal and the phase of the output signal from the delay line indicative of the delay-lock loop being in a locked condition.

29. The memory device of claim 21 wherein the first logic level is a logic "0" logic level and the second logic level is a logic "1" logic level so that the first predetermined transition of the internal clock signal and output signal from the delay line comprises a rising edge transition of the reference signal and the output signal from the delay line and the second predetermined transition of the internal clock signal and the output signal from the delay line comprises a falling edge transition of the reference signal and the output signal from the delay line.

30. The memory device of claim 21 wherein the selector comprises a switch having at least one first input terminal that receives the at least one output signal from the first phase detector and at least one second input terminal that receives the at least one output signal from the second phase detector, the switch being operable to couple the at least one first input terminal to at least one output terminal if the first phase detector is selected, the switch further being operable to couple the at least one second input terminal to at the least one output terminal if the second phase detector is selected, the at least one output terminal being coupled to at least one control input of the delay line.

31. The memory device of claim 21 wherein the memory cell array comprises a dynamic random access memory cell array.

32. A processor-based system, comprising:
a processor having a processor bus;
an input device coupled to the processor through the processor bus adapted to allow data to be entered into the computer system;
an output device coupled to the processor through the processor bus adapted to allow data to be output from the computer system; and
a memory device coupled to the processor bus adapted to allow data to be stored, the memory device comprising:
a row address circuit operable to receive and decode row address signals applied to external address terminals of the memory device;
a column address circuit operable to receive and decode column address signals applied to the external address terminals;
a memory cell array operable to store data written to and read from the array at a location determined by the decoded row address signals and the decoded column address signals;
a read data path circuit operable to couple read data signals from the memory cell array to external data terminals of the memory device, the read data signals being applied to the external data terminals responsive to a read data strobe signal;
a write data path circuit operable to couple write data signals from the external data terminals of the memory device responsive to a write data strobe signal, the write data signals being coupled to the memory cell array;
a command decoder operable to decode a plurality of command signals applied to respective external command terminals of the memory device, the command decoder being operable to generate control signals corresponding to the decoded command signals; and
a locked loop operable to generate either the write data strobe signal or the read data strobe signal from an internal clock signal, the locked loop comprising:

a delay line receiving the internal clock signal and delaying the internal clock signal to generate the output signal for use as either the write data strobe signal or the read data strobe signal, the delay of the output signal generated by the delay line relative to the internal clock signal corresponding to a control signal;

a single-edge first phase detector receiving the internal clock signal and the output signal from the delay line and generating at least one output signal indicative of only a phase relationship between a first predetermined transition of the internal clock signal and the first predetermined transition of the output signal from the delay line, the first predetermined transition being a transition from a first logic level to a second logic level;

a dual-edge second phase detector receiving the internal clock signal and the output signal from the delay line and generating at least one output signal, the at least one output signal being indicative of both a phase relationship between the first predetermined transition of the internal clock signal and the first predetermined transition of the output signal from the delay line and a phase relationship between a second predetermined transition of the internal clock signal and the second predetermined transition of the output signal from the delay line, the second predetermined transition being a transition from the second logic level to the first logic level; and a selector coupled to the first and second phase detectors and the delay line, the selector being operable to select the at least one output signal from the first phase detector for use as the control signal if the internal clock signal and the output signal from the delay line have a first phase relationship and to select the at least one output signal from the second phase detector for use as the control signal if the internal clock signal and the output signal from the delay line have a second phase relationship that is different from the first phase relationship.

33. The processor-based system of claim 32 wherein the at least one output signal from the first phase detector comprises at least one signal that decreases the delay of the delay line if the first predetermined transition of the internal clock signal leads the first predetermined transition of the output signal from the delay line and that increases the delay of the delay line if the first predetermined transition of the internal clock signal lags the first predetermined transition of the output signal from the delay line.

34. The processor-based system of claim 33 wherein the at least one output signal from the second phase detector comprises at least one output signal that decreases the delay of the delay line if the first predetermined transition of the internal clock signal leads the first predetermined transition of the output signal from the delay line and if the second predetermined transition of the internal clock signal leads the second predetermined transition of the output signal from the delay line, the least one output signal increasing the delay of the delay line if the first predetermined transition of the internal clock signal lags the first predetermined transition of the output signal from the delay line and if the second predetermined transition of the internal clock signal lags the second predetermined transition of the output signal from the delay line.

35. The processor-based system of claim 32 wherein the at least one output signal from the first phase detector comprises a first output signal generated if a first predetermined transition of the internal clock signal leads the first predetermined transition of the output signal from the delay line and a second output signal generated if the first predetermined transition of the internal clock signal lags the first predetermined transition of the output signal from the delay line.

36. The processor-based system of claim 35 wherein the at least one output signal from the second phase detector comprises a first output signal generated if the first predetermined transition of the internal clock signal leads the first predetermined transition of the output signal from the delay line and if the second predetermined transition of the internal clock signal leads the second predetermined transition of the output signal from the delay line, the at least one output signal from the second phase detector further comprising a second output signal generated if the first predetermined transition of the internal clock signal lags the first predetermined transition of the output signal from the delay line and if the second predetermined transition of the internal clock signal lags the second predetermined transition of the output signal from the delay line.

37. The processor-based system of claim 36, further comprising:

a capacitor; and a charge pump coupled to the selector to receive the first and second output signals selected by the selector, the charge pump being coupled to the capacitor and being operable to apply current to the capacitor having a first polarity responsive to the first output signal and being operable to apply current to the capacitor having a second polarity that is different from the first polarity responsive to the second output signal.

38. The processor-based system of claim 32 wherein the first phase relationship comprises the difference between the phase of the internal clock signal and the phase of the output signal from the delay line being less than a predetermined value.

39. The processor-based system of claim 38 wherein the first phase relationship comprises a phase relationship between the phase of the internal clock signal and the phase of the output signal from the delay line indicative of the loop being in a locked condition.

40. The processor-based system of claim 32 wherein the first logic level is a logic "0" logic level and the second logic level is a logic "1" logic level so that the first predetermined transition of the internal clock signal and output signal from the delay line comprises a rising edge transition of the reference signal and the output signal from the delay line and the second predetermined transition of the internal clock signal and the output signal from the delay line comprises a falling edge transition of the reference signal and the output signal from the delay line.

41. The processor-based system of claim 32 wherein the selector comprises a switch having at least one first input terminal that receives the at least one output signal from the first phase detector and at least one second input terminal that receives the at least one output signal from the second phase detector, the switch being operable to couple the at least one first input terminal to at least one output terminal if the first phase detector is selected, the switch further being operable to couple the at least one second input terminal to at the least one output terminal if the second phase detector is selected, the at least one output terminal being coupled to at least one control input of the delay line.

42. The processor-based system of claim 32 wherein the memory cell array comprises a dynamic random access memory cell array.

43. A method of generating an phase comparison signal indicative of the phase of a first input signal relative to the phase of a second input signal, the method comprising:

generating at least one first output signal indicative of only a comparison of a first predetermined transition of the first input signal and the first predetermined transition of the second input signal, the first predetermined transition being a transition from a first logic level to a second logic level, the at least one first output signal being generated by a single-edge phase detector;

generating at least one second output signal indicative of both a comparison of the first predetermined transition of the first input signal and the first predetermined transition of the second input signal and a comparison of a second predetermined transition of the first input signal and the second predetermined transition of the second input signal, the second predetermined transition being a transition from the second logic level to the first logic level, the at least one second output signal being generated by a dual-edge phase detector; and generating the phase comparison signal based on the at least one first output signal if the first and second input signals have a first phase relationship and based on the at least one second output signal if the first and second input signals have a second phase relationship that is different from the first phase relationship.

44. The method of claim 43 wherein the act of generating at least one first output signal comprises:

generating a first signal if the first predetermined transition of the first input signal leads the first predetermined transition of the second input signal; and generating a second signal generated if the first predetermined transition of the first input signal lags the first predetermined transition of the second input signal.

45. The method of claim 44 wherein the act of generating at least one second output signal comprises:

generating a first signal if the first predetermined transition of the first input signal leads the first predetermined transition of the second input signal and if the second predetermined transition of the first input signal leads the second predetermined transition of the second input signal; and generating a second signal generated if the first predetermined transition of the first input signal lags the first predetermined transition of the second input signal and if the second predetermined transition of the first input signal lags the second predetermined transition of the second input signal.

46. The method of claim 43 wherein the first phase relationship comprises the difference between the phase of the first input signal and the phase of the second input signal being less than a predetermined value.

47. The method of claim 43 wherein the first logic level is a logic "0" logic level and the second logic level is a logic "1" logic level so that the first predetermined transition of the first and second input signals comprises a rising edge transition of the first and second input signals and the second predetermined transition of the first and second input signals comprises a falling edge transition of the first and second input signals.

48. The method of claim 43 wherein the act of generating the phase comparison signal based on either the at least one first output signal or the at least one second output signal comprises:

selecting the at least one first output signal if the first and second input signals have the first phase relationship;

selecting the at least one second output signal if the first and second input signals have the second phase relationship;

generating the phase comparison signal based on the at least one selected signal.

49. A method of generating a feedback signal having a predetermined phase relationship to a reference signal, the method comprising:

delaying the reference signal by a delay to provide the feedback signal;

generating at least one first output signal indicative of only a comparison of a first predetermined transition of the reference signal and the first predetermined transition of the feedback signal, the first predetermined transition being a transition from a first logic level to a second logic level, the at least one first output signal being generated by a single-edge phase detector;

generating at least one second output signal indicative of both a comparison of the first predetermined transition of the reference signal and the first predetermined transition of the feedback signal and a comparison of a second predetermined transition of the reference signal and the second predetermined transition of the feedback signal, the second predetermined transition being a transition from the second logic level to the first logic level, the at least one second output signal being generated by a dual-edge phase detector;

selecting the at least one first output signal if the reference signal and the feedback signal have a first phase relationship;

selecting the at least one second output signal if the reference signal and the feedback signal have a second phase relationship that is different from the first phase relationship; and adjusting the delay value as a function of the selected at least one output signal.

50. The method of claim 49 wherein the act of generating at least one first output signal comprises:

generating a first signal if the first predetermined transition of the reference signal leads the first predetermined transition of the feedback signal; and generating a second signal if the first predetermined transition of the reference signal lags the first predetermined transition of the feedback signal.

51. The method of claim 50 wherein the act of generating at least one second output signal comprises:

generating a first signal if the first predetermined transition of the reference signal leads the first predetermined transition of the feedback signal and if the second predetermined transition of the reference signal leads the second predetermined transition of the feedback signal; and generating a second signal generated if the first predetermined transition of the reference signal lags the first predetermined transition of the feedback signal and if the second predetermined transition of the reference signal lags the second predetermined transition of the feedback signal.

52. The method of claim 49 wherein the first phase relationship comprises the difference between the phase of the first input signal and the phase of the second input signal being less than a predetermined value.

53. The method of claim 49 wherein the first logic level is a logic "0" logic level and the second logic level is a logic "1" logic level so that the first predetermined transition of the first and second input signals comprises a rising edge transition of the first and second input signals and the second predetermined transition of the first and second input signals comprises a falling edge transition of the first and second input signals.

54. The method of claim 49 wherein the act of generating the phase comparison signal based on either the at least one first output signal or the at least one second output signal comprises:
   selecting the at least one first output signal if the reference signal and the feedback signal have the first phase relationship;
   selecting the at least one second output signal if the reference signal and the feedback signal have the second phase relationship; and
   generating the phase comparison signal based on the at least one selected signal.

55. A method of operating a delay-lock loop having a single edge phase detector that generates a control signal based on a comparison between either a rising edge or a falling edge of a reference signal and a corresponding edge of a feedback signal and having a dual edge phase detector that generates a control signal based on both a comparison between the rising edge of the reference signal and the rising edge of a feedback signal and a comparison between the falling edge of the reference signal and the falling edge of a feedback signal, the method comprising:
   using the control signal generated by the dual edge phase detector to control the delay of the feedback signal relative to the reference signal until the delay-lock loop has substantially achieved a locked condition; and
   after the delay-lock loop has substantially achieved a locked condition, using the control signal generated by the single edge phase detector to control the delay of the feedback signal relative to the reference signal.

* * * * *

UNITED STATES PATENT AND TRADEMARK OFFICE
CERTIFICATE OF CORRECTION

PATENT NO. : 7,428,284 B2  
APPLICATION NO. : 11/080105  
DATED : September 23, 2008  
INVENTOR(S) : Lin It is certified that error appears in the above-identified patent and that said Letters Patent is hereby corrected as shown below:

In column 13, line 8, in Claim 13, delete "the least" and insert -- the at least --, therefor.

In column 14, line 2, in Claim 20, delete "at the" and insert -- the at --, therefor.

In column 15, line 23, in Claim 23, delete "the least" and insert -- the at least --, therefor.

In column 16, line 22, in Claim 30, delete "at the" and insert -- the at --, therefor.

In column 17, line 59, in Claim 34, delete "the least" and insert -- the at least --, therefor.

In column 18, line 61, in Claim 41, delete "at the" and insert -- the at --, therefor.

In column 19, line 1, in Claim 43, delete "an" and insert -- a --, therefor.

Signed and Sealed this

Twenty-fifth Day of November, 2008

JON W. DUDAS  
*Director of the United States Patent and Trademark Office*